(12) United States Patent
Lee

(10) Patent No.: US 7,637,799 B2
(45) Date of Patent: Dec. 29, 2009

(54) SUBSTRATE PRODUCTION APPARATUS FOR PRODUCING A SUBSTRATE FOR A DISPLAY DEVICE

(75) Inventor: Choong Un Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/457,254

(22) Filed: Jun. 4, 2009

(65) Prior Publication Data

US 2009/0247053 A1    Oct. 1, 2009

Related U.S. Application Data

(62) Division of application No. 11/166,724, filed on Jun. 27, 2005, now Pat. No. 7,547,245.

(30) Foreign Application Priority Data

Jun. 29, 2004    (KR)    ........................ 10-2004-049309

(51) Int. Cl.
B24B 49/00        (2006.01)
(52) U.S. Cl. .............................. 451/11; 451/10; 451/70
(58) Field of Classification Search ................... 451/10, 451/11, 41, 44, 54, 57, 65, 70, 914
See application file for complete search history.

(56) References Cited

U.S. PATENT DOCUMENTS

| | | | |
|---|---|---|---|
| 6,297,869 B1 | 10/2001 | Choo et al. | 349/187 |
| 7,048,614 B2 | 5/2006 | Uh et al. | 451/41 |
| 7,163,445 B2 | 1/2007 | Uh et al. | 451/41 |
| 2003/0190863 A1 | 10/2003 | Uh et al. | 451/5 |
| 2004/0001177 A1 | 1/2004 | Byun et al. | 349/187 |
| 2006/0121831 A1 | 6/2006 | Shin | 451/11 |

*Primary Examiner*—Eileen P. Morgan
(74) *Attorney, Agent, or Firm*—Morgan Lewis & Bockius LLP

(57) ABSTRACT

A substrate production apparatus for producing a substrate for a display device is disclosed. The substrate production apparatus includes a first production apparatus including a first scriber to scribe a first mother substrate into at least one first model substrate and at least one second model substrate, a first grinder to grind the first model substrate, and a first cleaning unit to clean the ground first model substrate. The substrate production apparatus also includes a second production apparatus including a second scriber to scribe a second mother substrate into at least one first model substrate and at least one second model substrate, a second grinder to grind the second model substrate, and a second cleaning unit to clean the ground second model substrate. Additionally, the substrate production apparatus includes a common buffer unit to store the second model substrate from the first production apparatus and to store the first model substrate from the second production apparatus. The first model substrates have different dimensions from the second model substrates.

7 Claims, 9 Drawing Sheets

SUBSTRATE PRODUCTION APPARATUS FOR PRODUCING A SUBSTRATE FOR A DISPLAY DEVICE

The present invention is a divisional application of application Ser. No. 11/166,724, filed on Jun. 27, 2005, now U.S. Pat. No. 7,547,245 which claims the benefit of the Korean patent Application No. 10-2004-49309 filed in on Jun. 29, 2004, which is hereby incorporated by reference.

BACKGROUND OF THE INVENTION

1. Field of the Invention

The present invention relates to a substrate production apparatus for producing a substrate for a display device, and more particularly, to a substrate production apparatus for producing a substrate for a display device using an MMG (Multi Model on a Glass) method.

2. Description of the Related Art

As information technology continues to develop, a demand for display devices in various forms is increasing. Accordingly, there have recently been researches on several types of display devices, such as a liquid crystal display LCD, a plasma display panel PDP, an electro-luminescent display ELD, a vacuum fluorescent display VFD, and so on. Some of these display devices have already been commercially developed and used as display devices in various existing electronic systems.

Among these display devices, the LCD produces an excellent picture quality, and has advantages of being light and thin and of consuming low power. Thus, the LCD has most widely been used as a substitute for a cathode ray tube CRT for use in portable information equipment, such as notebook computers. In addition, the LCD has been developed in various ways for use in desktop computer monitors and in television sets which receive broadcast signals to display picture images. However, the continued development of the LCD as a general screen display device in various systems depends on whether the LCD can attain a high quality picture of high precision, high brightness, large display area, and so on while maintaining its advantages of being light and thin, and of consuming low power.

An LCD generally includes a liquid crystal display panel to display a picture and a driver circuit to apply drive signals to the liquid crystal display panel. The liquid crystal display panel includes first and second glass substrates and a liquid crystal layer injected between the first and second glass substrates. The first substrate is a thin film transistor TFT substrate, and the second substrate is a color filter substrate.

The TFT substrate array includes a plurality of gate lines extending horizontally at fixed intervals and a plurality of data lines at fixed intervals extending in a vertical direction perpendicular to the gate lines. A plurality of pixel electrodes is formed in a matrix shape at pixel areas which are defined by intersections of the gate lines and the data lines. TFTs are provided at the intersections of gate lines and data lines and are connected to corresponding pixel electrodes. The signals to gate lines switch the corresponding TFTs on or off to transmit signals on the data lines to corresponding pixel electrodes.

The color filter substrate includes a black matrix layer to intercept a light outside the pixel areas; R, G, and B color filter layers to express colors; and a common electrode to help attain a picture. Alternatively, in an in-plane switching mode LCD, the common electrode is formed along with the pixel electrode on the first glass substrate. The first and second glass substrates are bonded together using a seal pattern, which has a liquid crystal injection hole and a spacer to maintain a fixed gap between the first and second substrates. Then, a liquid crystal material is injected into the gap between the first and second substrates through the injection hole.

A plurality of the first and second glass substrates can be made out of a large glass substrate (hereinafter, referred to as "a mother substrate") by performing a scribing process inclusive of cutting, a grinding process, and a cleaning process on the mother substrate.

To increase the production efficiency of the LCD panel glass substrate, a multi-model-on-a-glass (hereinafter, referred to as "MMG") method has recently been developed. The MMG method is a method with which glass substrates of various sizes are produced from one mother substrate to increase the production efficiency. Before the MMG method was developed, it was a general practice that only LCD panel glass substrates of the same dimensions were produced from one mother substrate. The remaining space on the mother substrate was wasted without being used because of a low yield of the LCD panel glass substrate and due to difficulties in the manufacturing process when attempts were made to utilize the remaining space. For example, in a fifth generation line using a 1100×1250 mm mother substrate, twelve pieces of 17" glass substrates or fifteen pieces of 15" glass substrates can be produced out of one mother substrate. However, there are spaces at the outer areas of the mother substrate that are not used. Thus, in practice, a glass area use efficiency, which is calculated by dividing the sum of the areas of the LCD panel glass substrates by the total area of the mother substrate, is in a range between about 70% and about 80%.

In contrast, if an MMG method is employed, large size panel glass substrates and smaller size panel glass substrates can effectively arranged on a single mother substrate to increase the glass area use efficiency of the mother substrate to 90% or higher. Accordingly, if the MMG method is employed in the above example of the fifth generation line, while the output of twelve pieces of 17" glass substrates from a single mother substrate is maintained, smaller size panel glass substrates, e.g., seven pieces of 7" panel glass substrates can be additionally produced from the same mother substrate. Typically, with the use of the MMG method, glass substrates ranging in size from 5" to about 8" can be additionally produced from a mother substrate while the output of the existing medium to large size panel glass substrates from the same mother substrate is maintained.

As described above, the scribing process inclusive of cutting, the grinding process and the cleaning process are sequentially performed in order to produce a plurality of panel glass substrates from a mother substrate. These production processes take place in a substrate production apparatus. Hereinafter, with reference to FIGS. 1 and 2, a substrate production apparatus employing the MMG method according to the related art is discussed.

FIGS. 1 and 2 are diagrams illustrating the substrate production apparatus employing the MMG method according to the related art. FIG. 1 is a diagram showing a main model production, and FIG. 2 is a diagram depicting a sub model production. Here, the main model MM is a glass substrate of about 17" or 15", and the sub model SM is a glass substrate of about 8" or 5".

As shown in FIGS. 1 and 2, the substrate production apparatus according to the related art includes a loading part 20a, 20b to load a mother substrate 10; a scriber 30a, 30b to scribe the loaded mother substrate 10; a grinder 40a, 40b to grind a cut part after cutting the scribed mother substrate 10 in a scribed shape; a cleaning unit 50a, 50b to clean the ground glass substrate; and an unloading part 60a, 60b to unload the cleaned glass substrate. The related art substrate production apparatus further includes a transfer device (not shown) to move the glass substrate between the parts within the substrate production apparatus.

As described above, the mother substrate 10 is cut in the scribed form by the scriber 30a, 30b, and then the cut part is appropriately ground by the grinder 40a, 40b. However, the grinder 40a, 40b is set to the particular dimensions of a selected model. Thus, if another model with different dimensions is input to the grinder 40a, 40b, an error may occur in the grinding operation.

In the related art apparatus, as shown in FIGS. 1 and 2, if another model with dimensions different from the pre-selected model is received, a buffer unit 70a, 70b is installed at the input part of the grinder 40a, 40b to store the non-selected model temporarily. For example, in the event that the grinder 40a and the cleaning unit 50a conducting the production process of the main model MM are installed in the substrate production apparatus, as shown in FIG. 1, the sub models SM cannot be properly processed by the grinder 40a. Thus, the sub models SM are not transferred to the grinder 40a, but are instead moved to the buffer unit 70a in a dotted line direction, shown in FIG. 1, to be temporarily stored. In contrast, the main models MM are transferred to the cleaning unit 50a through the grinder 40a along a solid line direction, shown in FIG. 1, to be processed. The operation is performed by a hand robot (not shown).

On the other hand, in the event that the grinder 40b corresponding to the sub model SM is installed as shown in FIG. 2, i.e., the devices inclusive of the grinder 40a which are adjusted to the dimensions of the main model MM in FIG. 1 are all replaced with devices that can process the sub model SM, the sub models SM temporarily stored at the buffer unit 70b are transferred to the cleaning unit 50b through the grinder 40b along the dotted line.

As described above, due to a technical limit in the substrate production apparatus employing the MMG method according to the related art, the grinding device and the cleaning device corresponding to a selected model are pre-installed. Thus, models with dimensions different from the pre-selected model cannot be processed at the same time. In order to process different models with the related art substrate production apparatus, the grinding device and the cleaning device must be replaced with the devices which are appropriate for different dimension of the models to carry out the production process. That is, even the two groups of glasses having different dimensions are prepared in the same scribing process at the same time, the following processes for grinding and cleaning the prepared glasses should be performed in a different processing line. Therefore, after preparing two groups of glasses, one group should be preserved in a buffer unit while the other group of glasses is proceeding with the grinding and cleaning devices. After replacing the grinding and cleaning devices with another specification satisfying the preserved group of glasses, the preserved group is proceeding with the grinding and cleaning process. Accordingly, the production operation becomes more complicated, and the productivity decreases.

SUMMARY OF THE INVENTION

Accordingly, the present invention is directed to a substrate production apparatus for producing a substrate for a display device that substantially obviates one or more of problems due to limitations and disadvantages of the related art.

It is an object of the present invention to provide a substrate production apparatus for producing a substrate for a display device using an MMG method that can simplify a substrate production process, thereby improving substrate productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other objects of the invention, a substrate production apparatus for producing a substrate for a display device, includes: a first production apparatus including a first scriber to scribe a first mother substrate into at least one first model substrate and at least one second model substrate, a first grinder to grind the first model substrate, and a first cleaning unit to clean the ground first model substrate; a second production apparatus including a second scriber to scribe a second mother substrate into at least one first model substrate and at least one second model substrate, a second grinder to grind the second model substrate, and a second cleaning unit to clean the ground second model substrate; and a common buffer unit to store the second model substrate from the first production apparatus and to store the first model substrate from the second production apparatus, where the first model substrates have different dimensions from the second model substrates.

In another aspect of the present invention, a substrate production apparatus for producing a substrate for a display device, includes: a first production apparatus to process a first mother substrate to generate at least one first model substrate and at least one second model substrate and to perform grinding and cleaning of the first model substrate; a second production apparatus to process a second mother substrate to generate at least one first model substrate and at least one second model substrate and to perform grinding and cleaning of the second model substrates; a relay device installed between the first and second production apparatuses to transfer the second model substrate generated at the first production apparatus to the second production apparatus and to transfer the first model substrate generated at the second production apparatus to the first production apparatus, wherein the first model substrates have different dimensions from the second model substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers are used throughout the drawings to refer to the same or like parts.

Figure 1:
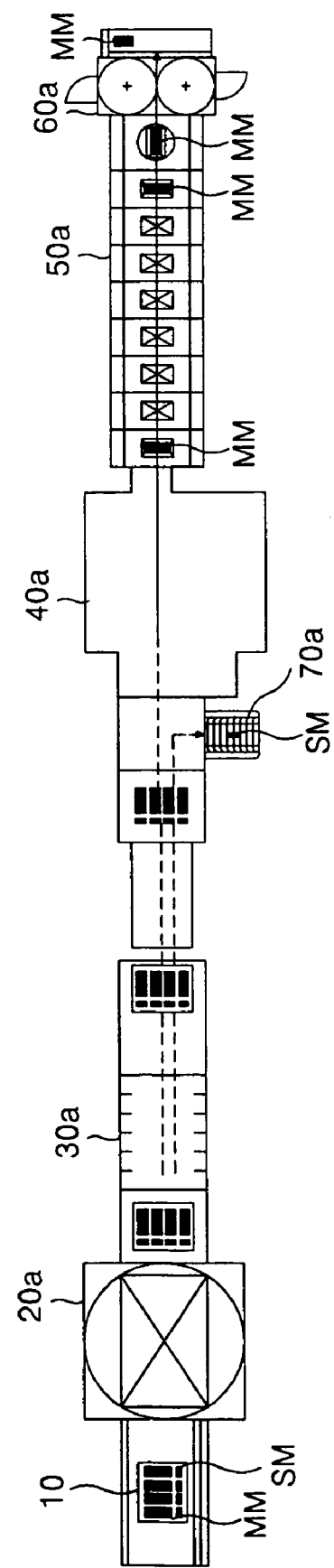
FIG. 1 is a diagram representing a substrate production apparatus employing an MMG method which produces a main model according to the related art.
Figure 2:
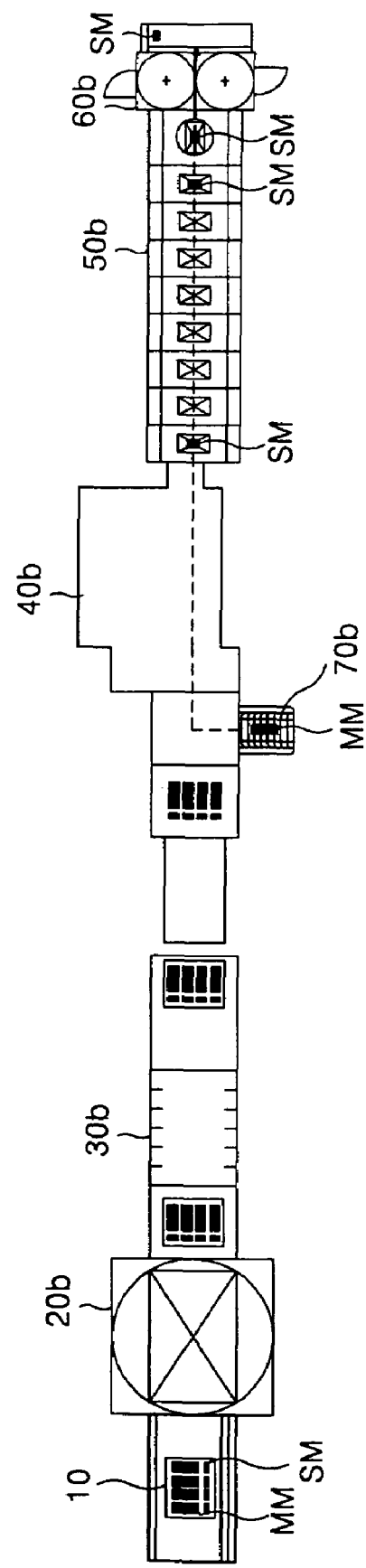
FIG. 2 is a diagram representing a substrate production apparatus employing an MMG method which produces a sub model according to the related art.
Figure 3:
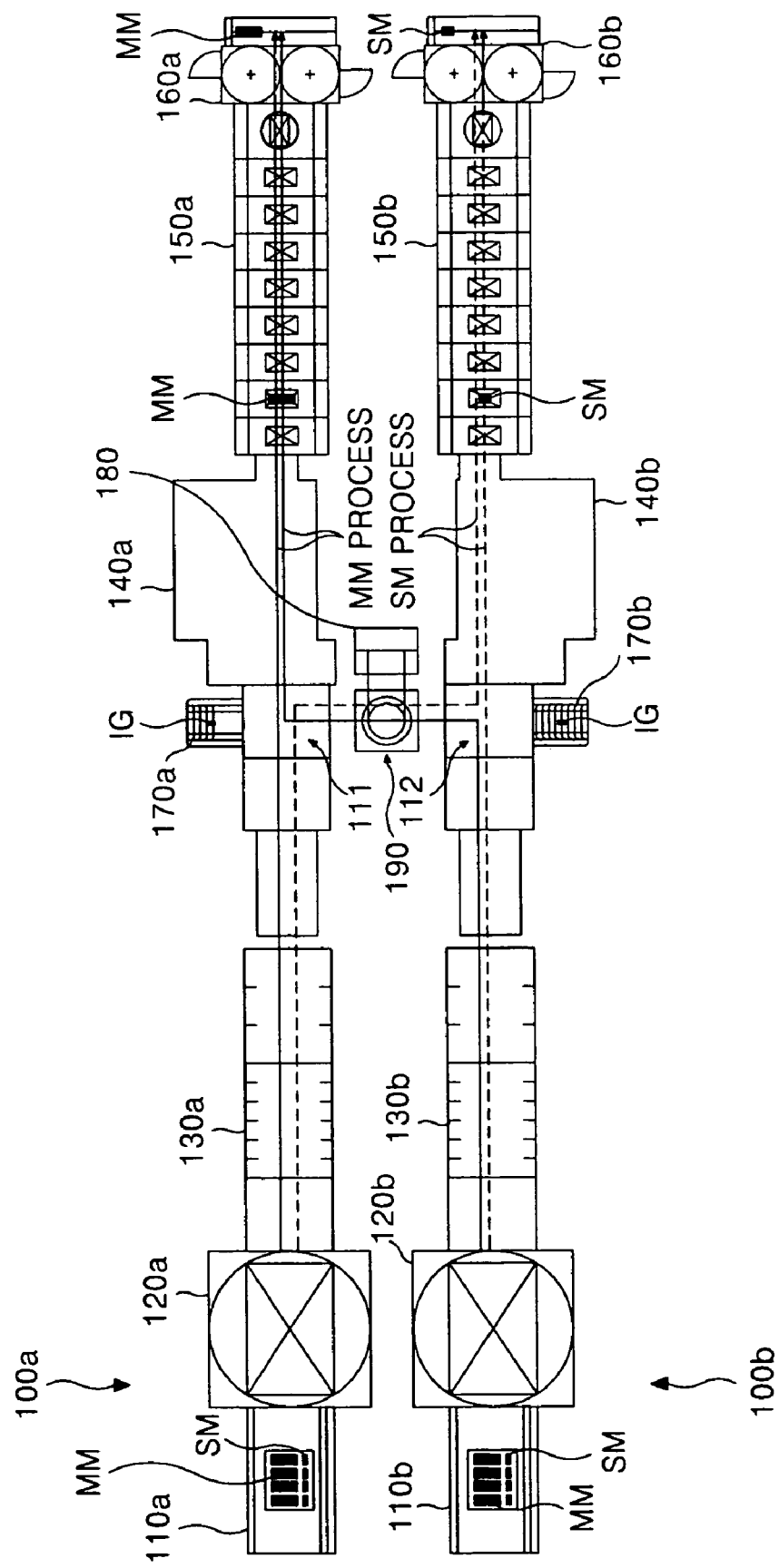
FIG. 3 is a diagram illustrating an apparatus for producing a substrate of a display device using an MMG method according to an exemplary embodiment of the present invention.
Figure 4:
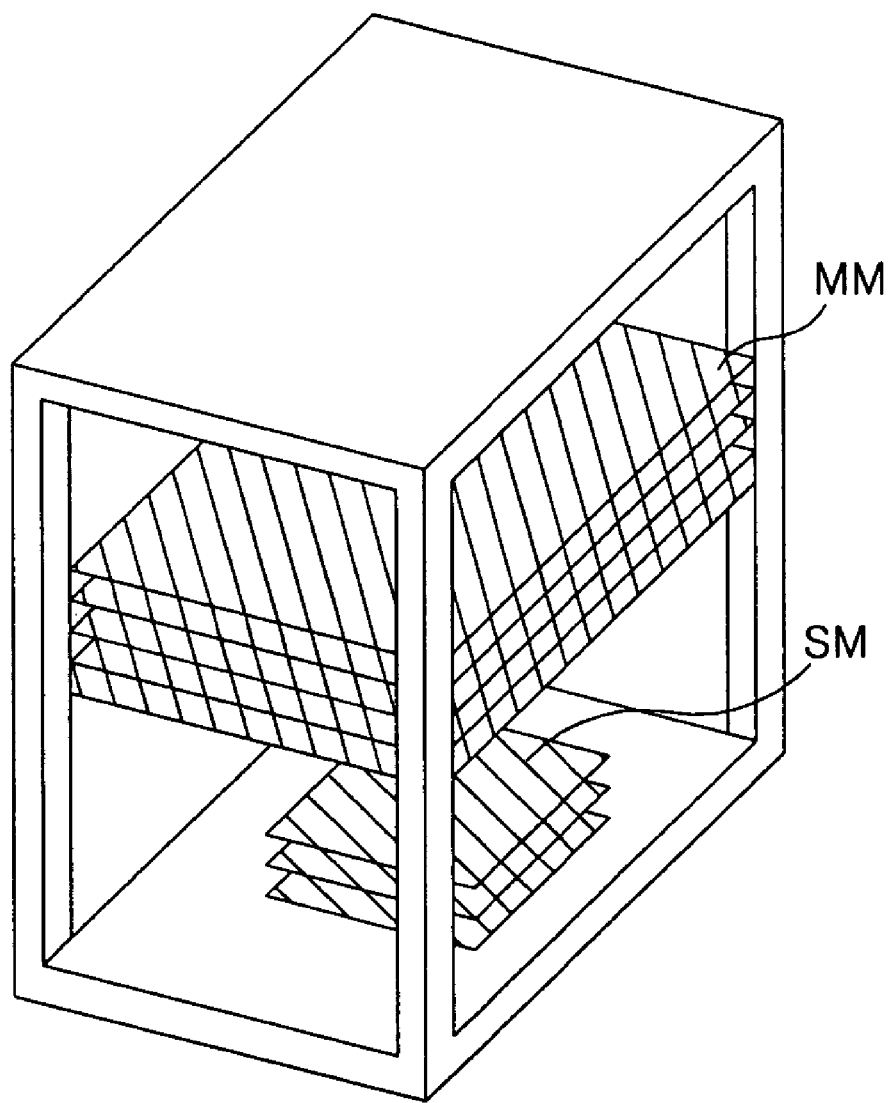
FIG. 4 is a diagram illustrating a common buffer unit of FIG. 3 in detail.
Figure 7:
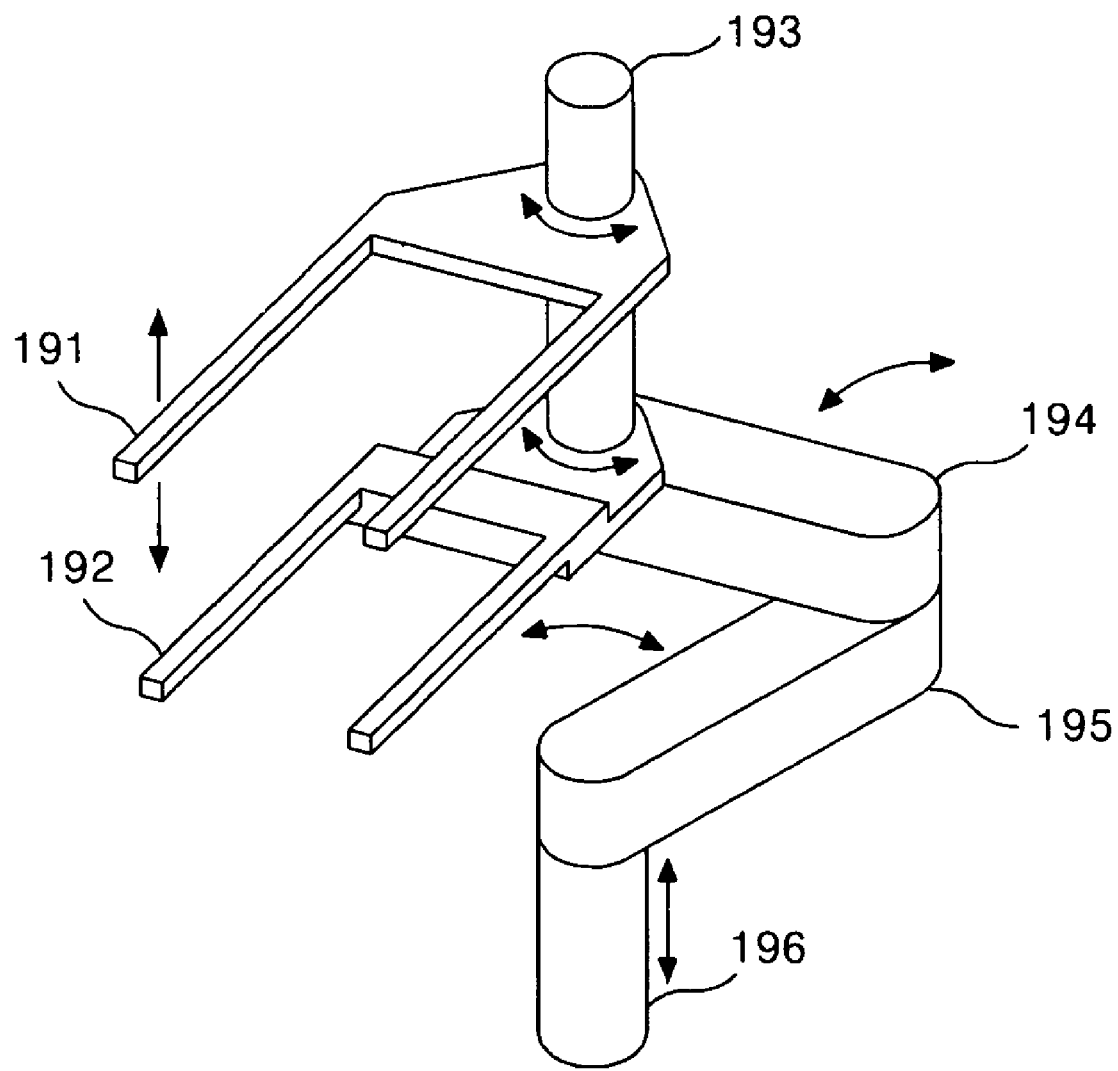
FIG. 7 is a diagram illustrating a first exemplary embodiment of a hand robot which has first and second forks.
Figure 8:
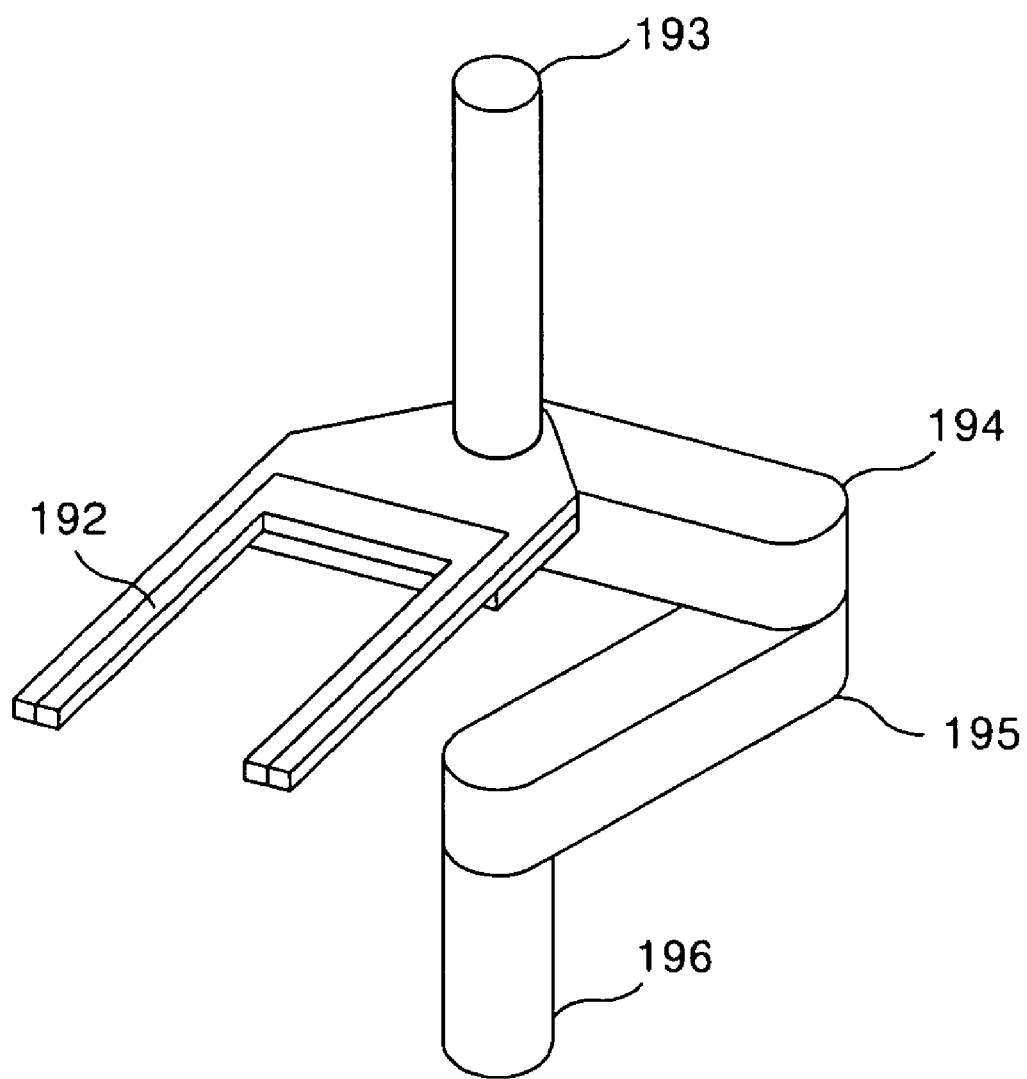
FIG. 8 is a diagram illustrating a second exemplary embodiment of a hand robot which has one fork where the second fork is integrated with the first fork.
Figure 9:
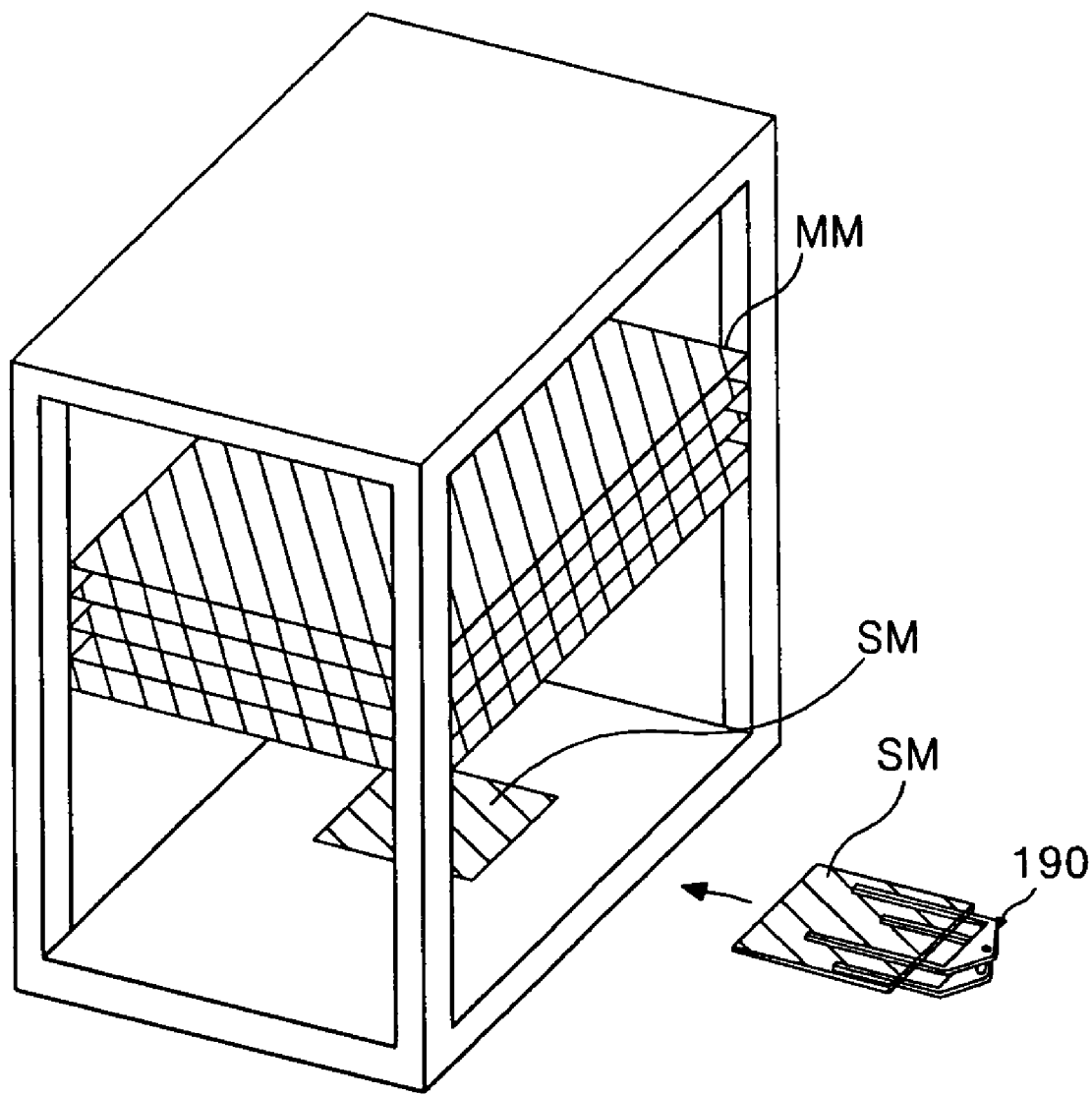
FIG. 9 is a diagram illustrating the hand robot transferring a sub model into the common buffer unit according to an embodiment of the present invention.

FIG. 3 is a diagram illustrating a substrate production apparatus for producing a substrate for a display device using an MMG method according to an exemplary embodiment of the present invention. FIG. 4 is a perspective view illustrating a common buffer unit shown in FIG. 3. FIGS. 7 and 8 illustrate exemplary embodiments of a hand robot for use in the apparatus shown in FIG. 3.

As shown in FIG. 3, the substrate production apparatus for producing a substrate for a display device using an MMG method according to an embodiment of the present invention has two production apparatuses 100a and 100b arranged in parallel. Grinders 140a and 140b and cleaning units 150a and 150B are respectively set to process panel substrate models having different dimensions. For example, in the substrate production apparatus 100a (hereinafter, referred to as "the first apparatus") shown in the upper half of FIG. 3, the grinder 140a and cleaning unit 150a corresponding to the main model MM are installed and set so as to process the main model MM. In the other substrate production apparatus 100b (hereinafter, referred to as "the second apparatus") shown in the bottom half of FIG. 3, the grinder 140b and cleaning unit 150b corresponding to the sub model SM are installed and set so as to process the sub model SM.

The first and second apparatuses 100a, 100b respectively include a loading part 120a, 120b to load a mother substrate 110a, 110b for an operation; a scriber 130a, 130b to scribe the loaded mother substrate 110a, 110b; a grinder 140a, 140b to grind a cut substrate after cutting the scribed mother substrate 110a, 110b in a scribed shape; a cleaning unit 150a, 150b to clean the ground glass substrate; and an unloading part 160a, 160b to unload the cleaned glass substrate. And each of the first and second apparatuses includes a transfer device (not shown) to move the glass substrate between the various parts within the apparatus. Here, the first and second apparatuses can further include, respectively, a buffer unit 170a, 170b to store a glass substrate (inferior glass or "IG"), which is processed as a defect after scribing the mother substrate 110a, 110b.

In addition, the substrate production apparatus according to the embodiment of the present invention includes a common buffer unit 180 which temporarily stores the main and sub models in order to exchange them, and a hand robot 190 which loads and unloads the glass substrate to and from the common buffer unit 180.

Figure 5:
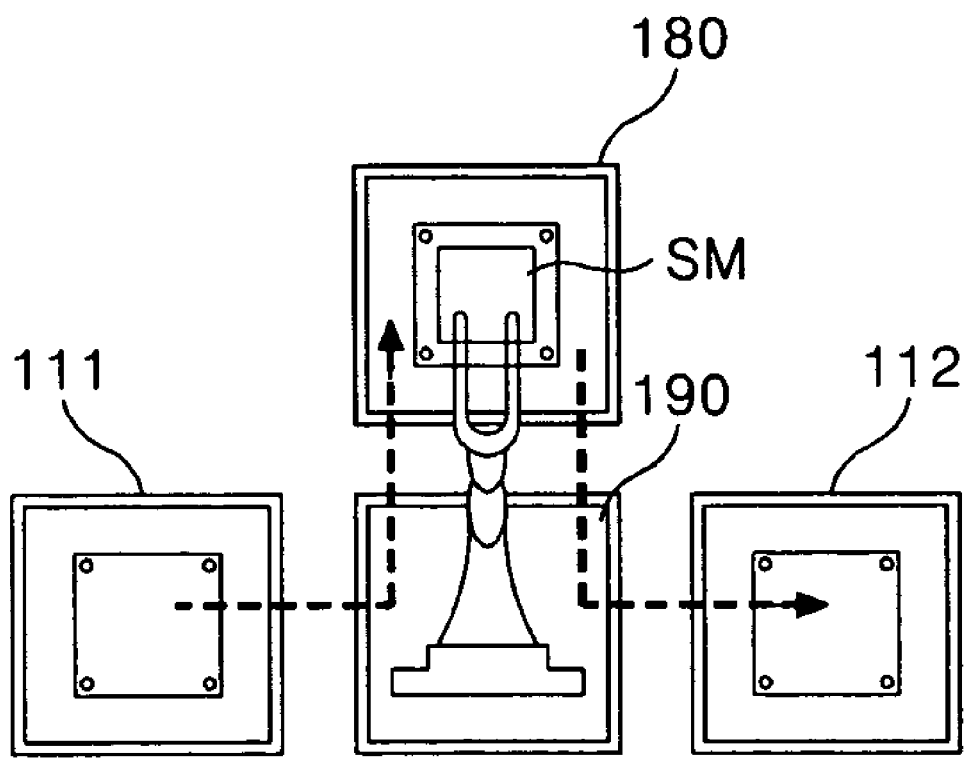
FIG. 5 is a diagram illustrating an exemplary operation by a hand robot of moving a sub model from a first port to a second port according to an exemplary embodiment of the present invention.
Figure 6:
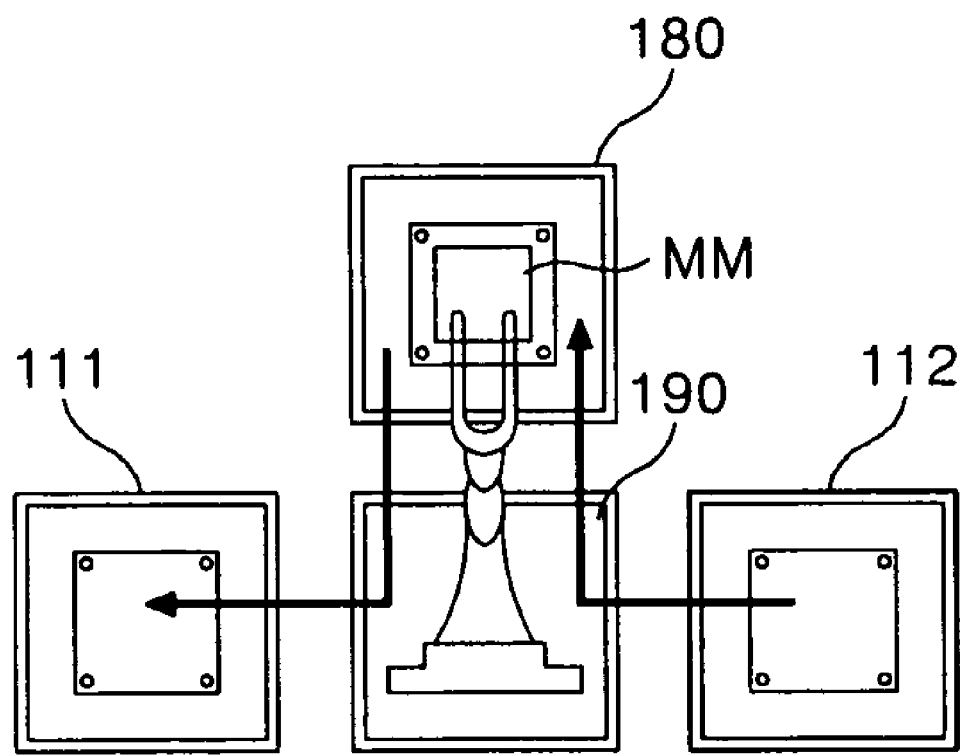
FIG. 6 is a diagram illustrating an exemplary operation by a hand robot of moving a main model from the second port to the first port according to an exemplary embodiment of the present invention.

For example, as shown in FIGS. 3-5, in the event that the sub model SM is generated by the scriber 130a of the first apparatus, the sub model SM is moved to a lower part of the common buffer unit 180 through a first port 111 with the use of the hand robot 190 and is temporarily stored in the common buffer unit 180. As shown in FIGS. 4 and 5, the sub model SM stored at the lower part of the common buffer unit 180 is then later transferred to a second port 112 by the hand robot 190. In a similar manner, as shown in FIGS. 3, 4, and 6, in the event that the main model MM is generated by the scriber 130b of the second apparatus, the main model MM is moved to an upper part of the common buffer unit 180 through the second port 112 with the use of the hand robot 190 and is temporarily stored in the common buffer unit 180. The main model MM stored at the upper part of the common buffer unit 180 is then later transferred to the first port 111 by the hand robot 190. The models transferred to the first port 111 from the common buffer unit 180 are processed by the first apparatus, and the models transferred to the second port 112 from the common buffer unit 180 are processed by the second apparatus.

The hand robot 190 can be of various forms and shapes. FIGS. 7 and 8 illustrate two exemplary embodiments of the hand robot 190. For example, as shown in FIG. 7, the hand robot 190 according to the first embodiment includes first and second forks 191, 192 which can rotate with a first hinge 193 as a pivot and which can have the panel substrate models safely placed and lifted on them; a first arm 194 to support the first hinge 193; and a second arm 195 to support the second hinge 196. As shown in FIG. 7, the arms, forks and hinges of the hand robot can move or rotate in various directions indicated by the arrows.

FIG. 8 illustrates a second embodiment of the hand robot in which the second fork 192 is integrated with the first fork 191 so as to form a single fork. The fork, arms and hinges of the hand robot according to the second embodiment of the hand robot can move or rotate in the similar manner as the first embodiment shown in FIG. 7.

Hereinafter, with reference to FIG. 3, the operation of the substrate production apparatus for producing a substrate for a display device using an MMG method according to an embodiment of the present invention is described. The description of the operation is based on the first apparatus 100a being set to process the main model MM and the second apparatus 100b being set to process the sub model SM.

First, the first and second apparatuses 100a and 100b sequentially and independently process respective substrates. If a glass substrate corresponding to the sub model SM is cut and transferred to the first port 111 in the scribing process of the first apparatus 100a, the hand robot 190 detects this by a sensor to move the sub model SM to the lower part of the common buffer unit 180. Then, the hand robot 190 loads the main model MM, which was previously stored at the upper part of the common buffer unit 190, to the first port 111. Here, the main model MM is a glass substrate that was previously cut by the scriber 130b in the second apparatus 100b and was temporarily stored at the common buffer unit 180 by the hand robot 190. The main model MM loaded to the first port 111 is then ground by the grinder 140a, cleaned by the cleaning unit 150a, and transferred to the unloading part 160a. The handling process for the main model MM is shown in a solid line in FIG. 3.

In the same manner as the production process in the first apparatus, if a glass substrate corresponding to the main model MM is cut and transferred to the second port 112 in the second apparatus 100b, the hand robot 190 detects this by a sensor to move the main model MM to the upper part of the common buffer unit 180. Then, the hand robot 190 loads the sub model SM, which was previously stored at the lower part of the common buffer unit 180, to the second port 112. Here, the sub model SM is a glass substrate that was previously cut by the scriber 130a in the first apparatus 100a and was temporarily stored at the lower part of the common buffer unit 180 by the hand robot 190. The sub model SM loaded to the second port 112 is then ground by the grinder 140b, cleaned by the cleaning unit 150b, and transferred to the unloading part 160b. The handling process of the sub model SM is illustrated in a dotted line shown in FIG. 3.

As described above, the substrate production apparatus for producing a substrate for a display device according to an embodiment of the present invention has a common buffer unit between the first and second apparatuses, which are set to produce glass substrates having different dimensions from each other, and enables an exchange of glass substrates of different dimensions between the first and second apparatuses with the use of the common buffer unit and hand robot, thereby simplifying the substrate production process and improving the substrate productivity.

It will be apparent to those skilled in the art that various modifications and variations can be made in the apparatus for producing a substrate for a display device using an MMG method according to the present invention without departing from the spirit or scope of the invention. Thus, it is intended that the present invention cover the modifications and variations of this invention provided they come within the scope of the appended claims and their equivalents.

What is claimed is:

1. A substrate production apparatus, comprising:
    a first production apparatus to process a first mother substrate to generate at least one first model substrate and at least one second model substrate from the first mother substrate, and to perform grinding with a first grinder and cleaning with a first cleaning unit on the first model substrate;
    a second production apparatus to process a second mother substrate to generate at least one first model substrate and at least one second model substrate from the second mother substrate, and to perform grinding with a second grinder and cleaning with a second cleaning unit on the second model substrate;
    a relay device installed between the first and second production apparatuses to transfer the second model substrate generated at the first production apparatus to the second production apparatus and to transfer the first model substrate generated at the second production apparatus to the first production apparatus,
    wherein the first model substrates have different dimensions from the second model substrates.

2. The substrate production apparatus according to claim 1, wherein the first production apparatus includes:
    a first scriber to scribe the first mother substrate;
    a first grinder to grind the first model substrate; and
    a first cleaning unit to clean the first model substrate received from the first grinder.

3. The substrate production apparatus according to claim 2, wherein the second production apparatus includes:
    a second scriber to scribe the second mother substrate;
    a second grinder to grind the second model substrate; and
    a second cleaning unit to clean the second model substrate from the second grinder.

4. The substrate production apparatus according to claim 3, wherein the first grinder is configured to grind the first model substrate scribed by the first scriber and the first model substrate scribed by the second scriber, and the second grinder is configured to grind the second model substrate scribed by the first scriber and the second model substrate scribed by the second scriber.

5. The substrate production apparatus according to claim 1, wherein the relay device includes:
    a common buffer unit to store the second model substrate from the first scriber and the first model substrate from the second scriber; and
    a hand robot configured to transfer the second substrate from the first scriber to the common buffer unit, transfer the first model substrate from the second scriber to the common buffer unit, transfer the first model substrate previously stored in the common buffer unit to the first production apparatus, and transfer the second model substrate previously stored in the common buffer unit to the second production apparatus.

6. The substrate production apparatus according to claim 1, wherein the first and second production apparatuses are arranged in parallel with the relay device therebetween.

7. The substrate production apparatus according to claim 1, wherein the first and second mother substrates have approximately the same dimensions.

* * * * *